(12) United States Patent
DiVergilio et al.

(10) Patent No.: US 7,845,310 B2
(45) Date of Patent: Dec. 7, 2010

(54) WIDE AREA RADIO FREQUENCY PLASMA APPARATUS FOR PROCESSING MULTIPLE SUBSTRATES

(75) Inventors: William F. DiVergilio, Brookline, MA (US); Aseem K. Srivastava, Andover, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 921 days.

(21) Appl. No.: 11/635,227

(22) Filed: Dec. 6, 2006

(65) Prior Publication Data

US 2008/0138992 A1    Jun. 12, 2008

(51) Int. Cl.
C23C 16/00    (2006.01)
C23F 1/00    (2006.01)
H01L 21/306    (2006.01)
H05B 31/26    (2006.01)

(52) U.S. Cl. .............................. 118/723 I; 118/723 IR; 118/723 AN; 118/728; 118/729; 118/730; 156/345.48; 156/345.51; 156/345.52; 156/345.53; 156/345.54; 156/345.55; 315/111.21; 315/111.51

(58) Field of Classification Search ............... 118/723 I; 156/345.48; 315/111.51
See application file for complete search history.

(56) References Cited

U.S. PATENT DOCUMENTS

| 5,368,710 | A |   | 11/1994 | Chen et al. | ............. 204/192.32 |
| 5,434,353 | A | * | 7/1995 | Kraus | ........................ 174/15.6 |
| 6,136,165 | A | * | 10/2000 | Moslehi | ................. 204/298.06 |
| 6,181,069 | B1 |   | 1/2001 | Tonotani et al. | |
| 6,811,757 | B2 |   | 11/2004 | Niv et al. | |
| 2003/0168172 | A1 | * | 9/2003 | Glukhoy | ................. 156/345.28 |
| 2005/0098117 | A1 |   | 5/2005 | DiVergilio et al. | ........ 118/723 E |
| 2006/0049138 | A1 | * | 3/2006 | Miyake et al. | ................. 216/58 |
| 2007/0144440 | A1 | * | 6/2007 | Yoneda et al. | ............ 118/723 I |

* cited by examiner

*Primary Examiner*—Parviz Hassanzadeh
*Assistant Examiner*—Rakesh Dhingra
(74) *Attorney, Agent, or Firm*—Cantor Colburn LLP

(57) ABSTRACT

An antenna array for a radio frequency plasma process chamber including, an array of electrodes, an array of dielectric tubes concentrically disposed about each electrode tube to define a chamber configured to be at atmospheric pressure between an outer surface of each electrode tube and an inner surface of the corresponding dielectric tube, and a hermetic seal between each dielectric tube and the plasma process chamber configured to allow a vacuum or low pressure in the plasma process chamber.

11 Claims, 5 Drawing Sheets

WIDE AREA RADIO FREQUENCY PLASMA APPARATUS FOR PROCESSING MULTIPLE SUBSTRATES

BACKGROUND

The present disclosure relates to a semiconductor apparatus, and more particularly, to a wide area radio frequency plasma source suitable for simultaneously ashing or etching multiple semiconductor substrates.

In ashing and etching applications, the use of radio frequency (RF) or microwave power is common. In induction RF plasma reactors, induction by RF occurs by generating a plasma discharge with a metal exciter i.e., electrode (typically in the form of a coil). Typically, in a capacitive discharge the wafer holder serves as an opposing electrode, while at the same time acts as a heating/cooling platen in order to maintain certain substrate temperature. The metal exciter is physically removed from the plasma discharge by a dielectric window of some sort, through which the high-frequency energy can be coupled. Having the metal exciter separated from the plasma discharge by a dielectric is necessary to prevent the plasma from striking the metal exciter and causing sputtering of metal from the exciter, which can deposit on the wafers leading to defects on the wafers, and substantially shorten exciter lifetime. As used herein, the term "wafer" shall mean any material substrate, including but not limited to silicon wafers, glass panels, dielectrics, metal films or other semiconductor material.

RF power at 13.56 MHz is predominantly used in plasma reactors because this frequency is an ISM (Industry, Scientific, Medical) standard frequency for which government mandated radiation limits are less stringent than at non-ISM frequencies, particularly those within the communication bands. The substantially universal use of 13.56 MHz is further encouraged by the large amount of equipment available at that frequency because of this ISM standard. Other ISM standard frequencies are at 27.12 and 40.68 MHz, which are the second and third order harmonics of the 13.56 MHz ISM standard frequency.

In the semiconductor industry, throughput is often a very important issue. With large volumes and low profit margins in the more competitive areas, incremental improvements in throughput can provide the necessary edge to compete successfully. In order to reduce manufacturing costs and increase throughput, it is advantageous to process more than one wafer simultaneously. Not only does this reduce the cost of ownership for the process tool, but also, the cost of generating the plasma can be amortized over multiple wafers thereby reducing the production cost per wafer. The difficulty in simultaneously processing multiple wafers in RF reactors is that significant mechanical problems arise. For example, when multiple wafers are processed in the same vacuum chamber and using one RF exciter, the excitation region is about 70 cm in diameter, which would require a very large, thick and heavy dielectric to make the vacuum. For such a three-wafer vacuum chamber, a single quartz piece (dielectric) is projected to be as great as 8 cm thick and weigh greater than 90 kilograms (kg), making it very expensive. Moreover, plasma uniformity is generally an issue if one simply increases the area processed in the RF reactor.

Accordingly, there remains a need for improved apparatuses for processing multiple wafers simultaneously.

BRIEF SUMMARY

Disclosed herein are plasma generating components, apparatuses, and methods for generating a plasma. In one embodiment, an antenna array for a radio frequency plasma process chamber comprises an array of metal electrodes; a dielectric tube concentrically disposed about each metal electrode of the array of metal electrodes; and a hermetic seal between each dielectric tube and the plasma process chamber.

In another embodiment, a plasma generating apparatus for simultaneously processing one or more substrates within a single vacuum process chamber comprises a gas source; a vacuum process chamber adapted to process the one or more substrates simultaneously, the process chamber having a top wall, a bottom wall and sidewalls extending therebetween, the top wall including one or more openings in fluid communication with the gas source, an antenna array intermediate the one or more openings and a wafer pedestal, wherein the antenna array comprises a plurality of hermetically sealed and serially connected conductor segments, each one of the conductor segments comprising an electrode and a dielectric material concentrically disposed about the electrode; and a power source electrically coupled to the antenna array.

A method of plasma processing multiple wafers in a process chamber includes, introducing a source gas to the process chamber, wherein the process chamber comprises a top wall, a bottom wall and sidewalls extending therebetween, the top wall including one or more openings in fluid communication with the gas source, a wafer pedestal configured to control the temperature of a wafer, an antenna array intermediate the one or more openings and the wafer pedestal comprising a plurality of hermetically sealed and serially connected conductor segments, each one of the conductor segments comprising an electrode and a dielectric material concentrically disposed about the electrode, and a power source electrically coupled to the antenna array, changing an operating pressure within the process chamber and maintaining atmospheric pressure within the conductor segment, and generating a plasma within the process chamber by flowing a current through the conductor segments of the antenna array with a power source.

The above described and other features are exemplified by the following figures and detailed description.

BRIEF DESCRIPTION OF THE DRAWINGS

Refer now to the figures, which are exemplary embodiments, and wherein like elements are numbered alike.

DETAILED DESCRIPTION OF THE PREFERRED EMBODIMENTS

Figure 1:
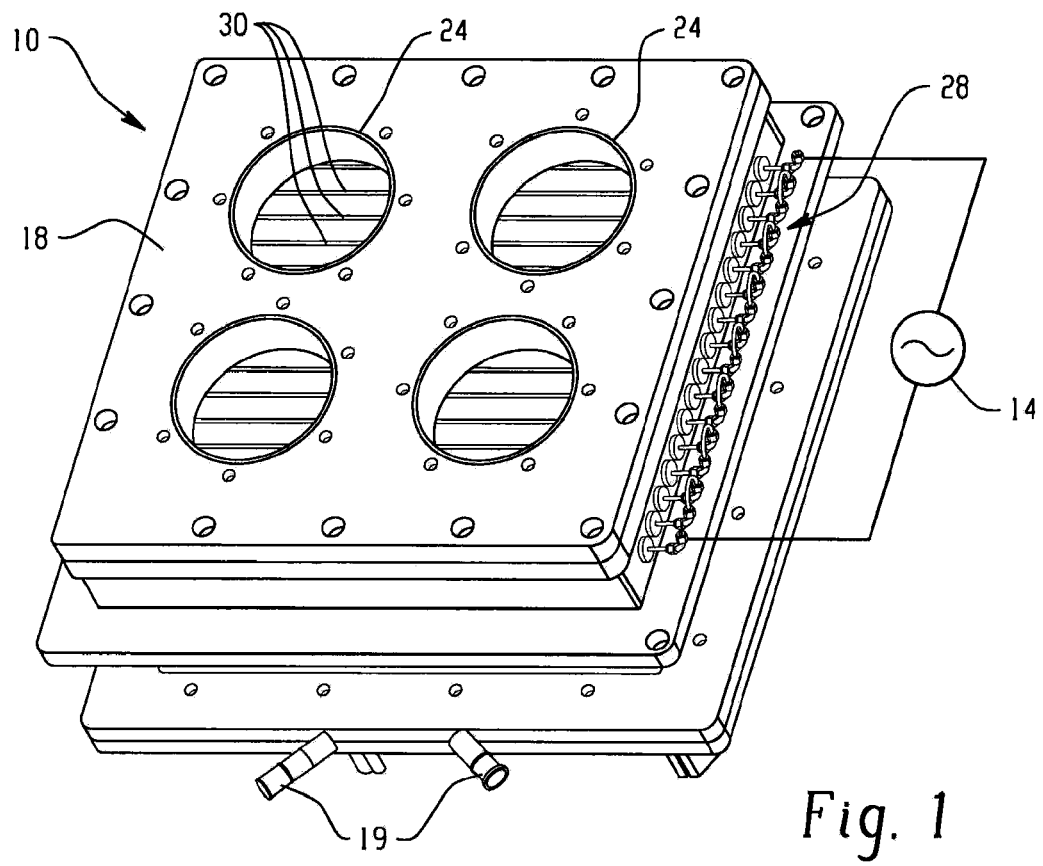
FIG. 1 shows a partial perspective view illustrating a wide area RF plasma reactor apparatus capable of processing up to four wafers simultaneously.
Figure 2:
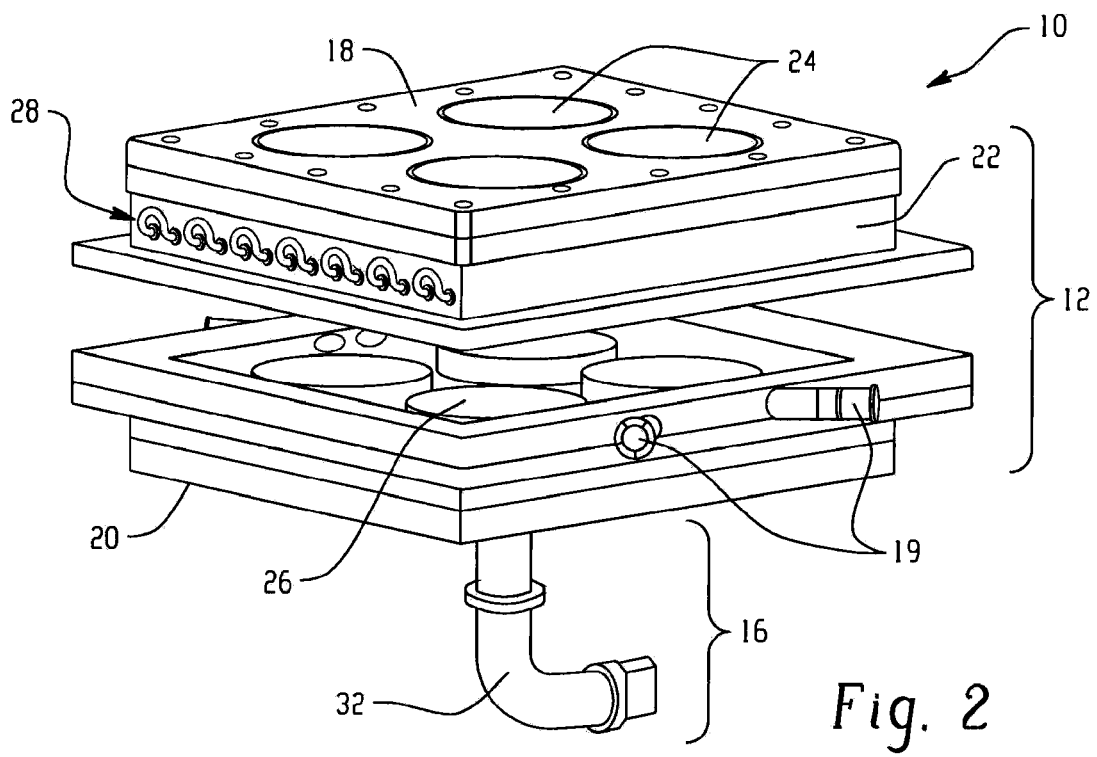
FIG. 2 illustrates a partial perspective exploded view illustrating the area RF plasma reactor apparatus of FIG. 1.

FIGS. 1 and 2 generally illustrate a wide area RF plasma reactor apparatus 10 suitable for use in ashing or etching applications where multiple wafers can be processed simultaneously. Briefly stated, it has been discovered that by placing high frequency excitation elements inside the vacuum process chamber (i.e., inside the plasma), with each element contained within a dielectric tube, a wide area plasma source can be created without the need for a large and expensive dielectric window or bell jar, such as noted in the background section. As such, plasma is prevented from contacting the exciter elements. In one embodiment, the vacuum connection for the wide surface area needed to process four wafers at a time, as an example, can be made using a metal lid less than 2 centimeters (cm) thick. Moreover, the excitation elements, collectively referred to as the antenna system, can be subdivided into multiple straight tubes depending on the desired plasma area for a given application. A plasma generating apparatus designed in this manner provides lightweight, low-cost flexibility over the standard plasma generating apparatus.

Referring now to FIGS. 1 and 2, the wide area RF plasma reactor apparatus 10 generally comprises a process chamber 12, a power source 14, and an exhaust assembly component 16. Although the apparatus 10 in FIG. 1 has a square shape, other suitable shapes will be apparent to those skilled in the art in view of this disclosure and the desired plasma surface area. Also, the terms "a", "an", and "the" do not denote a limitation of quantity, but rather denote the presence of at least one of the referenced item.

The process chamber 12 generally has a top wall 18, a bottom portion 20, and sidewalls 22 extending therebetween. The top wall further comprises at least one gas input flanges (openings) 24, and in the present example there are four flanges. The process chamber 12 further comprises a wafer pedestal 26 within an interior of the process chamber. The wafer pedestals 26 function as a temperature control mechanism for the wafer, whereby a heated platen provides heat to the wafer, or a cooled platen removes heat from the wafer. In one embodiment, the number of wafer pedestals 26 generally corresponds to the number of gas flanges. Likewise, the diameter of the gas flanges is about the same as or greater than the diameter of a wafer pedestal 26.

In the embodiment described above, each gas input flange 24 is positioned such that when the process chamber 12 is sealed, each flange 24 is coaxial to the corresponding wafer pedestal 26. It should be clear to those practiced in the art that the number of gas input flanges need not be coaxial to the pedestal, and need not be equal to the number of pedestals in the chamber. A gas source (not shown) may be disposed in fluid communication with gas input flange 24. Suitable gases for generating plasma are well known to those skilled in the art of both etching and ashing, which include, but are not intended to be limited to, oxygen or oxygen containing gases, fluorine containing gases, hydrogen or hydrogen containing gases, helium, argon, neon, other inert gases, hydrocarbons, and combinations comprising one or more of the foregoing gases. The wafer substrate pedestal 26 can be any suitable support generally known in the art such as, heated wafer chucks, lift pins, and the like.

The process chamber 12 further includes an antenna system comprising an planar array 28 of single antenna conductors 30 coupled together and in electrical communication with the power source 14 and with discrete electric components. Each conductor 30 is substantially parallel to an adjacent conductor. The antenna array 28 in the present example extends from one sidewall to an opposing sidewall to form a grating and is positioned intermediate the gas flanges 24 and the underlying wafer pedestal 26. As will be discussed in greater detail below, the antenna array 28 provides excitation energy for plasma generation of gases flowing through the gas flanges 24 within the process chamber 12.

Additional openings 19 may also be disposed in the process chamber 12 for purposes generally known in the art such as, for example, a mass spectrometer inlet for analyzing gaseous species evolved during processing, endpoint detection, and the like. Moreover, the process chamber 12 may further include additional features depending on the application. For example, in ashing applications, a quartz window may be installed and a UV light source may be placed in proximity to the wafer. Such a non-columnar light source may have a wavelength similar to UV excited lasers, which have been shown to enhance photoresist removal in bulk strip applications, and as such, could be used in parallel with the plasma generated reactive gases. Moreover, pre- and post-photoresist strip exposure to the light source could also provide residue removal and implanted resist removal advantages. Overhead RF sources, optical ports, gas analyzers, additional light sources, and the like could also be used either independently, or in combination, with the process chamber 12 providing an extremely flexible process platform. Other openings include one or more slit valves (not shown) disposed in the sidewall 22 for inserting and removing the substrates from the process chamber 12.

The process chamber 12 also includes an exhaust opening (not shown) disposed in the bottom wall 20 so as to provide an axial fluid flow in the chamber 12. An inlet of the exhaust conduit 32 is fluidly attached to the exhaust opening below each wafer chuck in the process chamber 12. It is to be understood that the exhaust conduit 32 has been simplified to illustrate only those components that are relevant to an understanding of the present disclosure. Those of ordinary skill in the art will recognize that other components may be required to produce an operational plasma generating apparatus 10. However, because such components are well known in the art, and because they do not further aid in the understanding of the present disclosure, a discussion of such components is not provided.

Depending on the desired process (i.e., etching, ashing), operating pressures within the process chamber 12 are preferably about 1 millitorr to about 3 torr, with about 200 millitorr to about 2 torr more preferred, and with about 500 millitorr to about 1.5 torr even more preferred. These operating pressures in the chamber are achieved using adequate process gas flows through the gas source and by using a throttle, or butterfly valve in fluid contact with the exhaust conduit 24 and exhaust opening. The power is in a range of less than about 100 watts up to a few thousand watts, at a frequency of about 0.5 megahertz (MHz) to 30 MHz.

Figure 3:
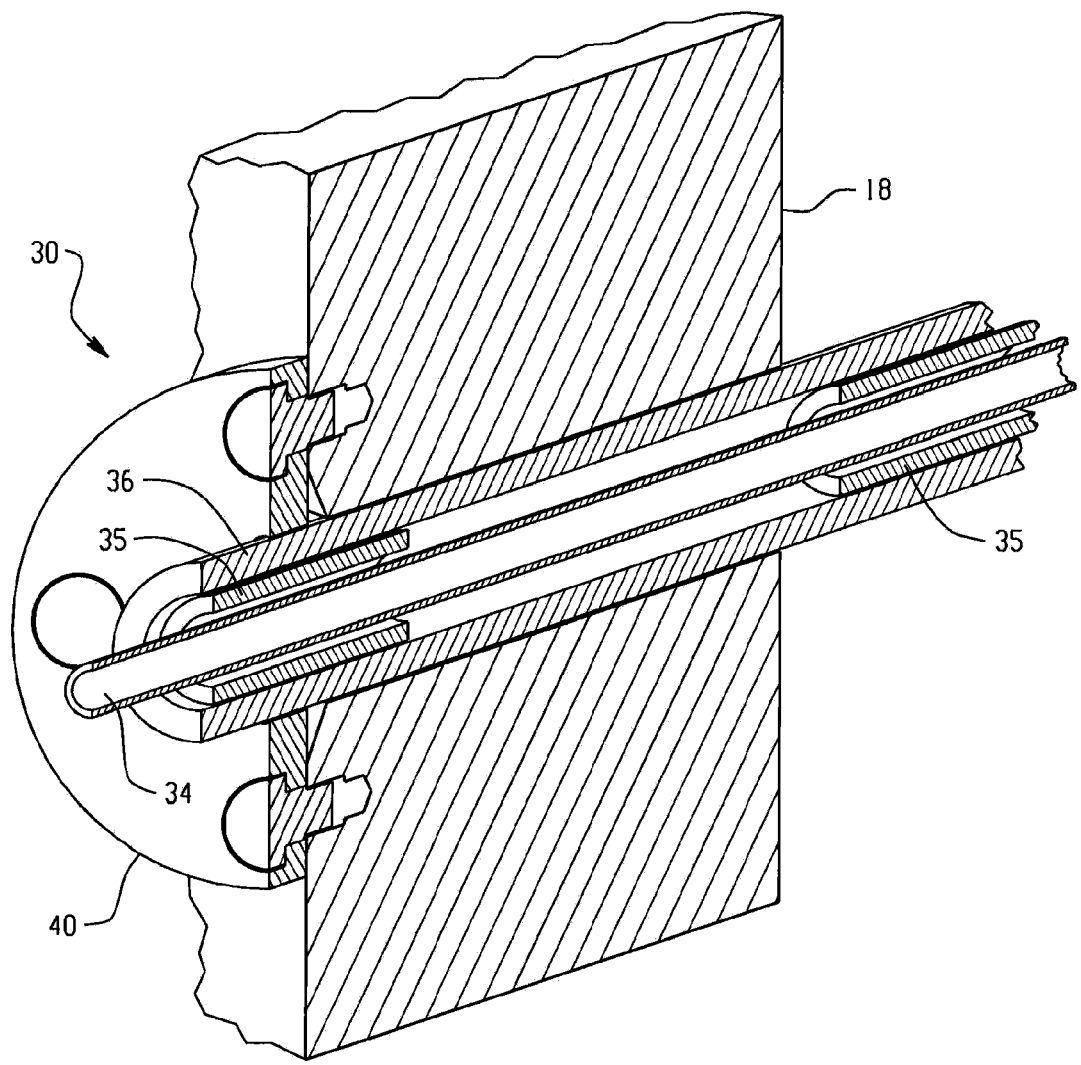
FIG. 3 is a cross-sectional view of an exemplary conductor segment.

Turning now to FIG. 3, a single conductor segment 30 of the antenna array 28 is illustrated. The conductor segment 30 comprises a metal electrode 34 in the form of a tube. In one embodiment, the metal electrode 34 may be a solid rod. The electrode tube may further be selected to have an outer diameter up to 0.25 inches. Surrounding the electrode 34 is a dielectric material 36. The dielectric material 36 is in the form of a tube and encases the electrode 34 to define a chamber between an outer surface of the electrode tube 34 and an inner surface of the dielectric tube 36. Fluid, such as air or low loss dielectric fluid, under positive pressure, can be fed through this chamber between the two tubes for system cooling purposes.

A washer 35 is disposed intermediate the electrode 34 and the dielectric tube 36. The washer 35 may be formed of a ceramic, a fluoropolymer, and the like. The washer 35 has an inner diameter just larger than an outer diameter of the electrode 34, yet smaller than an inner diameter of the dielectric tube 36. The washer 35 advantageously keeps the electrode 34 floating to inhibit the cool electrode 34 from contacting the hot dielectric tube 36 and prevent thermal shock. A hermetic seal 40 placed at each end of the dielectric tube 36 seals the dielectric tube 36 to selected walls 22 of the process chamber 12. Consequently, the process chamber 12 can be maintained at a desired vacuum pressure while the electrode 34 within the dielectric tube 36 remains at atmospheric pressure, even though the antenna array 28 is exposed to the vacuum pressure. The electrode 34 is preferably made of copper, but can be any metal commonly used as suitable electrodes for plasma generation such as aluminum, brass, copper-beryllium, etc. The dielectric tube 36 is preferably made of quartz. However, other dielectric materials such as sapphire or ceramic materials can also be used. Further, the electrode 34 may also be made of a dielectric material, such as those disclosed above, which has an outer surface coated with a conducting metal, such as aluminum, silver, copper, and the like. In another optional embodiment, the electrode 34 can be the dielectric tube 36 with an electrically conducting coating on the inner surface of the dielectric tube. Additionally, cooling fluid, such as water, can be passed through the electrode tube 34 to provide effective cooling of the conductor segments during plasma generation.

Figure 4:
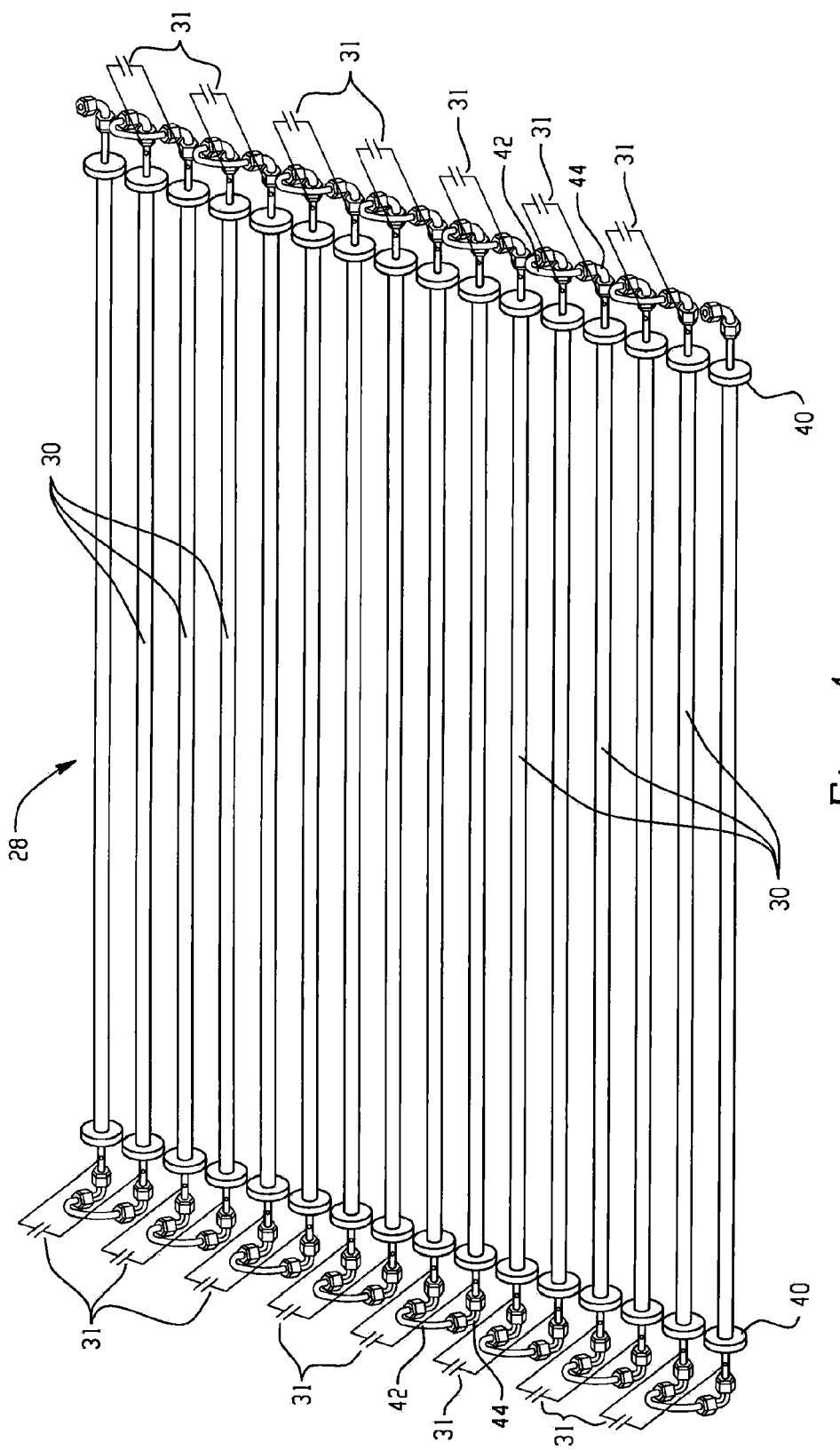
FIG. 4 shows a perspective view of the antenna system, which generates plasma in the process chamber.

Referring now to FIG. 4, a perspective view of the antenna array 28 is illustrated. In the present example, the antenna array 28 is comprised of 16 separate conductor segments 30. In this example, each conductor segment 30 is spaced 5 cm apart and the antenna array 28 illustrates a possible design for covering up to four standard 300 millimeter (mm) wafers in one chamber. It should be understood, however, that any number "N" of such conductor segments 30 may be employed and such variations are contemplated by the present disclosure, wherein "N" is an integer greater than 1. Similar antenna systems with varying numbers of conductor segments and alternate spacing may be suitable in view of the particular process application and the desired plasma surface area and will be apparent to those skilled in the art. The antenna array 28 is fed with energy by the power source 14 (shown in FIG. 1) which travels through each electrode tube 34 of each conductor segment 30. Although reference is made to inductively coupling the gas mixture with RF power to form the plasma, other means could be employed in an effective manner such as by capacitive excitation or a combination thereof. Additionally, other frequencies in the ISM band may be used to excite the plasma depending on the desired application. Frequencies outside of the ISM band may also be employed, given adequate shielding of any stray radiation such that radiation emission levels from the tool are within FCC regulations. A variable frequency system, such as, but not limited to, the one described in U.S. Pat. No. 6,305,316, incorporated herein by reference in its entirety, may also be used as a power source. In such a variable frequency system the load reactance is part of the tank circuit that determines the frequency of operation, and as the load changes, e.g., during the removal of photoresist from the substrate, the frequency changes to adapt to the load. One advantage of this technique is that by monitoring the frequency change one can very effectively and reliably determine end-of-process on the wafers without the added expense and complexity of optically monitoring the plasma glow for surface reaction products.

The electrically continuous inductive antenna array will provide excitation for plasma generation within process chamber 12.

Figure 5:
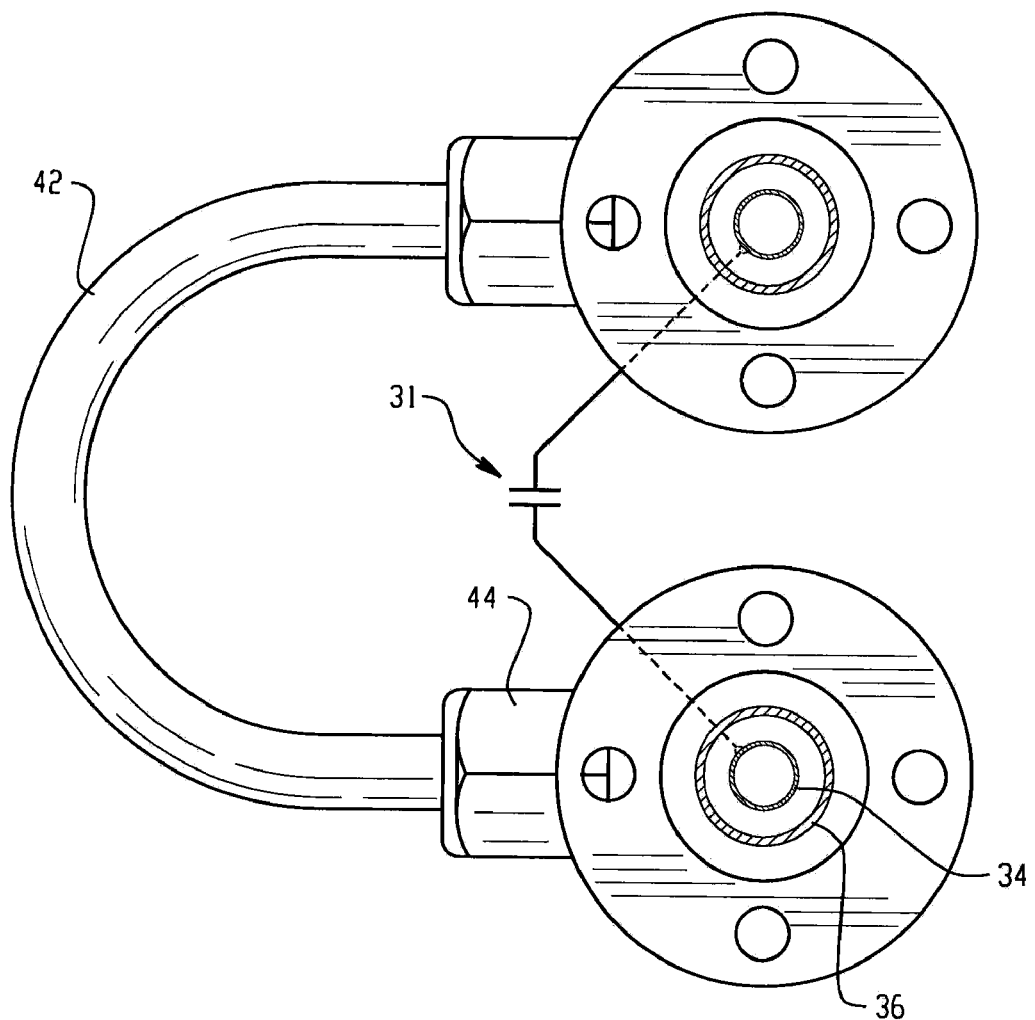
FIG. 5 illustrates a sectional view of a cooling tube connection for connecting the conductor segments.

In one embodiment, each conductor segment 30 can be connected with the adjacent conductor segment in the array 28 with a cooling tube 42. The cooling tube 42 is formed of an RF compatible material and allows a cooling fluid to pass through the entire antenna array 28, providing effective cooling of the system during plasma generation. The cooling tubes 42 are connected to each conductor segment with dielectric fittings 44. The fittings 44 and cooling tubes 42 are preferably made of Teflon or any other compatible dielectric. FIG. 5 illustrates the cooling tube connection.

Because the path length of the electrical current supplied by power source 14 becomes large as the number of conductor segments 30 in antenna array 28 increases, a large voltage difference across the antenna array 28 may be generated. Higher voltage portions of the antenna array 28 will couple more energy capacitively to the plasma than lower voltage portions, leading to plasma non-uniformities. In order to reduce the voltage difference problem, the conductor segments in the array 28 are serially coupled together through capacitors 31, and two of the conductor segments are coupled externally to the power source 14.

The antenna array 28 of the present disclosure operates in the following manner. A time dependent current is generated in the conductor segments 30 via the power source 14. The time-varying current produces a magnetic field that surrounds the conductive segments in accordance with Faraday's law. Because the current is time-varying, the produced magnetic field is a time-varying field. In accordance with Maxwell's equations, the time-varying magnetic field induces a time-varying electric field normal thereto; wherein the time-varying electric field extends along a direction of the conductor segments 30 and decays as the field extends away therefrom. This time-varying electric field is referred to as the inductive electric field component since it is induced from the time-varying magnetic field.

The time-varying inductive electric field accelerates charged particles such as free electrons in the chamber near the conductor segments 30. Further, the conductor segments are configured such that the velocity of the accelerated charged particles is sufficient so that the charged particles move through the region associated with a conductor in a time that is short compared to the period (T) of the time-varying current. Consequently, the charged particles see a substantially steady field as it travels along the conductor segment 30. Therefore the time-varying electric field "heats" the charged particles that then have sufficient energy to ionize the source gas atoms within the process chamber 12 upon collision therewith. The ionizing collisions operate to generate the plasma and such plasma generation is substantially symmetric in accordance with the configuration of the antenna array 28.

The antenna array 28 has a voltage across each conductor segment that spatially varies along a length of the electrode tube 34. Consequently, the varying charge distribution along a conductor segment 30 produces an electrostatic field that extends from the conductor segments outwardly, and the strength of the field varies spatially along the length of the electrode tube 34. This electrostatic field component is referred to as the capacitive field component. Because this field is not uniform, the contribution of this field component to plasma generation is non-uniform, and thus it is desirable for this electric field component to be reduced as much as possible.

A faraday shield may be used to block or minimize the capacitive field component. In such a solution, the faraday shield is placed between the conductors and the plasma. Such a solution, however, increases circuit losses and is practically difficult to configure. The antenna system 28 of the present disclosure overcomes the disadvantages of the prior art and provides a structure that substantially reduces the capacitive field contribution of the system without use of a faraday shield, as will be further appreciated below.

The antenna array 28 divides what conventionally was a single conductor into "N" conductor segments 30 (e.g., N=16 as illustrated in FIG. 4), wherein each conductor segment 30 is direct current isolated from one another, but in series via capacitors. Such an arrangement reduces the peak capacitive electric field component by a factor of N. Preferably the values of L (associated with the conductors 30), C (the capacitors), and f (the frequency of the signal from the power source 14) are selected so that the magnitude of the reactance of the inductive component ($2\pi fL$) is equal to the magnitude of the reactance of the capacitive component ($1/2\pi fC$). In the above manner, a resonant circuit exists, in which the voltage drop across each inductive element L is equal and opposite to the voltage drop across each capacitive element C. Thus, the maximum voltage drop is reduced by a factor of "N" compared to the case of N inductive elements in series without capacitive elements. Also, although some variation still occurs along a length of a conductor segment 30, it is N times smaller than a conventional arrangement, and as illustrated in FIG. 4, such variation is itself symmetric due to the arrangement of the conductor segments.

The antenna array 28 thus operates to generate plasma within the process chamber 12, wherein the generated plasma is symmetric. The symmetry of the plasma advantageously helps to provide a spatially uniform current at the wafers. Optionally, an electromechanically controlled mechanism can be used to selectively turn off and/or turn on sections of the antenna array 28 to allow plasma processing in only certain portions of the process chamber.

Figure 6:
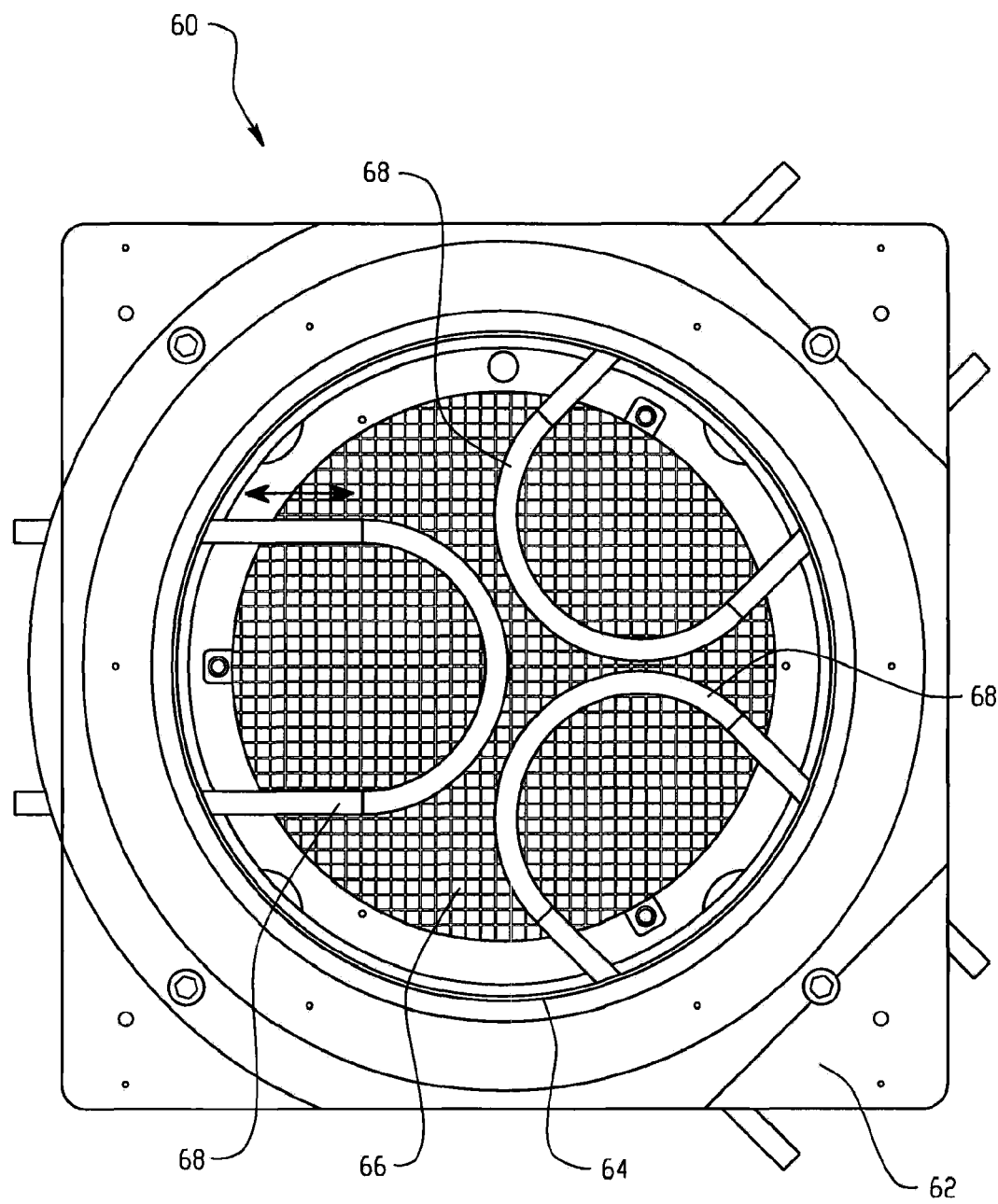
FIG. 6 illustrates a top-down view of a RF plasma reactor apparatus.

FIG. 6 shows another exemplary embodiment of a RF plasma reactor apparatus 60. The plasma reactor 60 generally comprises a process chamber 62. The process chamber 62 has a gas input flange 64, but may optionally have more than one gas input flange. Likewise, the process chamber 62 further comprises a wafer pedestal 66, but may optionally have more than one pedestal. The process chamber further includes a planar antenna array 68 composed of a single antenna conductor segments 30 in sliding engagement with the side wall of the process chamber. Although three discrete conductors are shown in FIG. 6, it is to be understood that any number of conductor segments can be used depending on various factors, such as process chamber size, number of wafers for simultaneous processing, plasma region, and the like. While the conductors 30 are similar to those described above and shown in FIGS. 3-5, the conductors of FIG. 6 include arcuate portions rather than the linear rods as shown in FIGS. 3-5. It is to be understood, however, that the conductor segments 30 are not limited to the specific shapes shown. For example, if the dielectric material is coated on the outer surface of the electrode to form the conductor segment 30, then the conductor could have any shape. If the dielectric material is a tube concentrically disposed about the electrode and is used to form the conductor segment 30, then physical constraints in disposing the electrode within the tube may limit the choice of shapes, such as would be appreciated by those skilled in the art.

The plasma reactor apparatus 60 advantageously allows for an individual conductor segment 30 to be slideably adjusted through the sidewall in the process chamber 62. This planar adjustment can beneficially be done without touching the other conductor segments 30 of the planar array 68. Moreover, it is possible for the adjustment to be done dynamically during processing. By repositioning, adding, or removing individual conductor segments 30 in the plasma reactor apparatus, plasma generation regions within the process chamber 62 can be dynamically changed to affect photoresist removal, etching, and plasma uniformity.

Unless otherwise specified, the materials for fabricating the various components include metals, ceramics, glasses, quartz, polymers, composite materials, and combinations comprising at least one of the foregoing materials. For example, suitable metals include anodized aluminum, and/or stainless steel. Suitable ceramic materials include silicon carbide, or aluminum oxide (e.g., single crystal or polycrystalline).

Advantageously, as mentioned above, the components and systems of plasma generation disclosed herein may allow for a reduction in production and equipment cost and increased operating life over existing plasma processing systems. More particularly, the wide area plasma generation that is capable due to the conductive element being disposed within the plasma vacuum chamber rather than outside over a cumbersome and expensive dielectric window, makes processing multiple wafer substrates simultaneously more cost effective than existing processing apparatuses. Additionally, the antenna system disclosed above generates uniform plasma capable of ashing or etching multiple wafers at the same time, thereby increasing throughput and decreasing production cost per wafer, all without sacrificing plasma process quality.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A plasma generating apparatus for processing one or a plurality of substrates within a single vacuum process chamber, the apparatus comprising:
    a gas source;
    a vacuum process chamber adapted to process the one or a plurality of substrates, the process chamber having a top wall, a bottom wall and sidewalls extending therebetween, the top wall including one or more openings in fluid communication with the gas source and wherein the vacuum process chamber includes a plurality of wafer pedestals;
    an antenna array intermediate the one or more openings and the plurality of wafer pedestals, wherein the antenna array comprises a plurality of conductor segments serially coupled together through capacitors, each one of the conductor segments comprising a floating electrode and a dielectric tube concentrically disposed about the floating electrode, wherein the floating electrode is free from contact with the dielectric tube and the electrode floats in a washer disposed intermediate the electrode and the dielectric tube, and wherein the dielectric tube is hermetically sealed at each end against the sidewalls of the process chamber such that the vacuum process chamber can be evacuated during operation thereof while the floating electrode is at atmospheric pressure;

a power source in electrical communication with two of the conductor segments.

2. The plasma generating apparatus of claim 1, wherein the plurality of conductor segments are comprised of individual conductor segments, wherein at least one of the individual conductor segments is slideably disposed in the sidewall, such that movement of the at least one individual conductor segment changes a planar position.

3. The plasma generating apparatus of claim 1, wherein the electrode is a tube.

4. The plasma generating apparatus of claim 1, wherein each one of the conductor segments is fluidly and serially coupled to a cooling tube.

5. The plasma generating apparatus of claim 1, wherein the power source is a radio frequency power supply.

6. The plasma generating apparatus of claim 1, wherein the vacuum process chamber has an exhaust aperture disposed in the bottom wall.

7. The plasma generating apparatus of claim 1, wherein the antenna array is substantially planar.

8. The plasma generating apparatus of claim 1, wherein each one of the conductor segments are equidistantly spaced apart from one another.

9. The plasma generating apparatus of claim 1, wherein the electrode is formed of a copper metal and the dielectric tube is formed of a quartz metal.

10. The plasma generating apparatus of claim 1, wherein each conductor segment is direct current isolated from one another and disposed in series via capacitors such that each conductor segment provides a resonant circuit, with a resonant frequency substantially the same as an operating frequency.

11. The plasma generating apparatus of claim 1, further comprising an electromechanically controlled mechanism configured to selectively turn off and turn on sections of the antenna array.

* * * * *